(12) United States Patent
Ke et al.

(10) Patent No.: US 11,873,575 B2
(45) Date of Patent: Jan. 16, 2024

(54) INGOT PULLER APPARATUS HAVING HEAT SHIELDS WITH VOIDS THEREIN

(71) Applicant: GlobalWafers Co., Ltd., Hsinchu (TW)

(72) Inventors: Jiaying Ke, Spring, TX (US); Sumeet S. Bhagavat, St. Charles, MO (US); Jaewoo Ryu, Chesterfield, MO (US); Benjamin Meyer, Defiance, MO (US); William Luter, St. Charles, MO (US); Carissima Marie Hudson, St. Charles, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

(21) Appl. No.: 17/496,535

(22) Filed: Oct. 7, 2021

(65) Prior Publication Data

US 2022/0170176 A1    Jun. 2, 2022

Related U.S. Application Data

(60) Provisional application No. 63/119,200, filed on Nov. 30, 2020.

(51) Int. Cl.
| | | |
|---|---|---|
| *C30B 15/10* | (2006.01) | |
| *C30B 15/08* | (2006.01) | |
| *C30B 29/06* | (2006.01) | |
| *C30B 35/00* | (2006.01) | |

(52) U.S. Cl.
CPC .............. *C30B 15/10* (2013.01); *C30B 15/08* (2013.01); *C30B 29/06* (2013.01); *C30B 35/002* (2013.01); *Y10T 117/1032* (2015.01); *Y10T 117/1068* (2015.01)

(58) Field of Classification Search
CPC ......... C30B 15/08; C30B 15/10; C30B 15/14; C30B 29/06; C30B 35/002; Y10T 117/1032; Y10T 117/1068
See application file for complete search history.

(56) References Cited

U.S. PATENT DOCUMENTS

| | | | |
|---|---|---|---|
| 5,868,836 A * | 2/1999 | Nakamura | C30B 15/206 117/200 |
| 6,893,499 B2 | 5/2005 | Fusegawa et al. | |
| 10,487,418 B2 | 11/2019 | Daggolu et al. | |
| 2001/0055689 A1 | 12/2001 | Park | |
| 2004/0055531 A1 * | 3/2004 | Ferry | C30B 15/14 117/217 |
| 2019/0136408 A1 * | 5/2019 | Basak | C30B 15/206 |

(Continued)

FOREIGN PATENT DOCUMENTS

| | | | |
|---|---|---|---|
| CN | 111763985 A * | 10/2020 | ............. C30B 15/00 |
| JP | H05330975 A | 12/1993 | |

(Continued)

OTHER PUBLICATIONS

ISR and Written Opinion for International Application No. PCT/US2021/060918, 11 pages, dated Feb. 10, 2022.

*Primary Examiner* — Hua Qi
(74) *Attorney, Agent, or Firm* — Armstrong Teasdale LLP

(57) ABSTRACT

Ingot puller apparatus for preparing a single crystal silicon ingot by the Czochralski method are disclosed. The ingot puller apparatus includes a heat shield. The heat shield has a leg segment that includes a void (i.e., an open space without insulation) disposed in the leg segment. The heat shield may also include insulation partially within the heat shield.

11 Claims, 8 Drawing Sheets

(56) References Cited

U.S. PATENT DOCUMENTS

2020/0224327 A1* 7/2020 Kajiwara .............. C30B 15/203
2022/0002898 A1* 1/2022 Xue ........................ C30B 29/06

FOREIGN PATENT DOCUMENTS

| JP | 2000327479 A | * | 11/2000 |
| JP | 2000327479 A | | 11/2000 |
| WO | 200050671 A1 | | 8/2000 |

* cited by examiner

INGOT PULLER APPARATUS HAVING HEAT SHIELDS WITH VOIDS THEREIN

CROSS-REFERENCE TO RELATED APPLICATION

This application claims the benefit of U.S. Provisional Patent Application No. 63/119,200, filed Nov. 30, 2020, which is incorporated herein by reference in its entirety.

FIELD OF THE DISCLOSURE

The field of the disclosure relates to ingot puller apparatus for preparing a single crystal silicon ingot by the Czochralski method and, in particular, ingot puller apparatus having a heat shield with a void (e.g., an area without insulation) disposed within the heat shield.

BACKGROUND

Single crystal silicon is the starting material for fabricating many electronic components such as semiconductor devices and solar cells. Single crystal silicon is commonly prepared using the Czochralski ("CZ") method. Briefly, the Czochralski method involves melting polycrystalline silicon ("polysilicon") in a crucible to form a silicon melt, lowering a seed crystal into contact with the melt to initiate crystal growth, and then pulling a single-crystal ingot from the melt.

Some ingot puller apparatus include a heat shield (sometimes referred to as a "reflector") above the melt that shrouds the ingot as the ingot is withdrawn from the melt. The heat shield includes insulation throughout the heat shield to maintain the temperature of the ingot as the ingot is withdrawn from the melt. Wafers sliced from ingots grown in such ingot puller apparatus include defects in a radial band close to the edge of the wafer. These defects include large in-grown voids and oxygen precipitates which may lead to gate-oxide-integrity ("GOI") failures. Such failures are particularly troubling for Perfect Silicon (PS) wafer products that are used, for example, for new generation memory devices.

A need exists for ingot puller apparatus that produce ingots having a reduced number and/or a reduced size of defects such as voids and oxygen precipitates.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to an ingot puller apparatus for growing a monocrystalline silicon ingot from a melt of silicon. The apparatus includes a puller housing defining a growth chamber. A crucible is disposed within the growth chamber for containing the melt of silicon. The ingot puller apparatus includes a pulling mechanism for pulling the ingot from the melt along a pull axis. A heat shield is disposed within the growth chamber. The heat shield defines a central passage for receiving the ingot as the ingot is pulled by the pulling mechanism. The heat shield has a leg segment that extends downward relative to the pull axis. The leg segment has a void formed therein.

Another aspect of the present disclosure is directed to an ingot puller apparatus for growing a monocrystalline silicon ingot from a melt of silicon. The apparatus includes a housing defining a growth chamber. A crucible is disposed within the growth chamber for containing the melt of silicon. A pulling mechanism is configured to pull the ingot from the melt along a pull axis. A heat shield is disposed within the growth chamber. The heat shield defines a central passage for receiving the ingot as the ingot is pulled by the pulling mechanism. The heat shield has a leg segment that extends along the pull axis. The leg segment comprises a foot at a distal end of the leg segment that extends radially inward. The foot includes a radially inward lower sidewall and a radially inward upper sidewall. The radially inward lower sidewall and radially inward upper sidewall angle toward each other and form an apex. The apex is the most radially inward portion of the heat shield.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Figure 1:
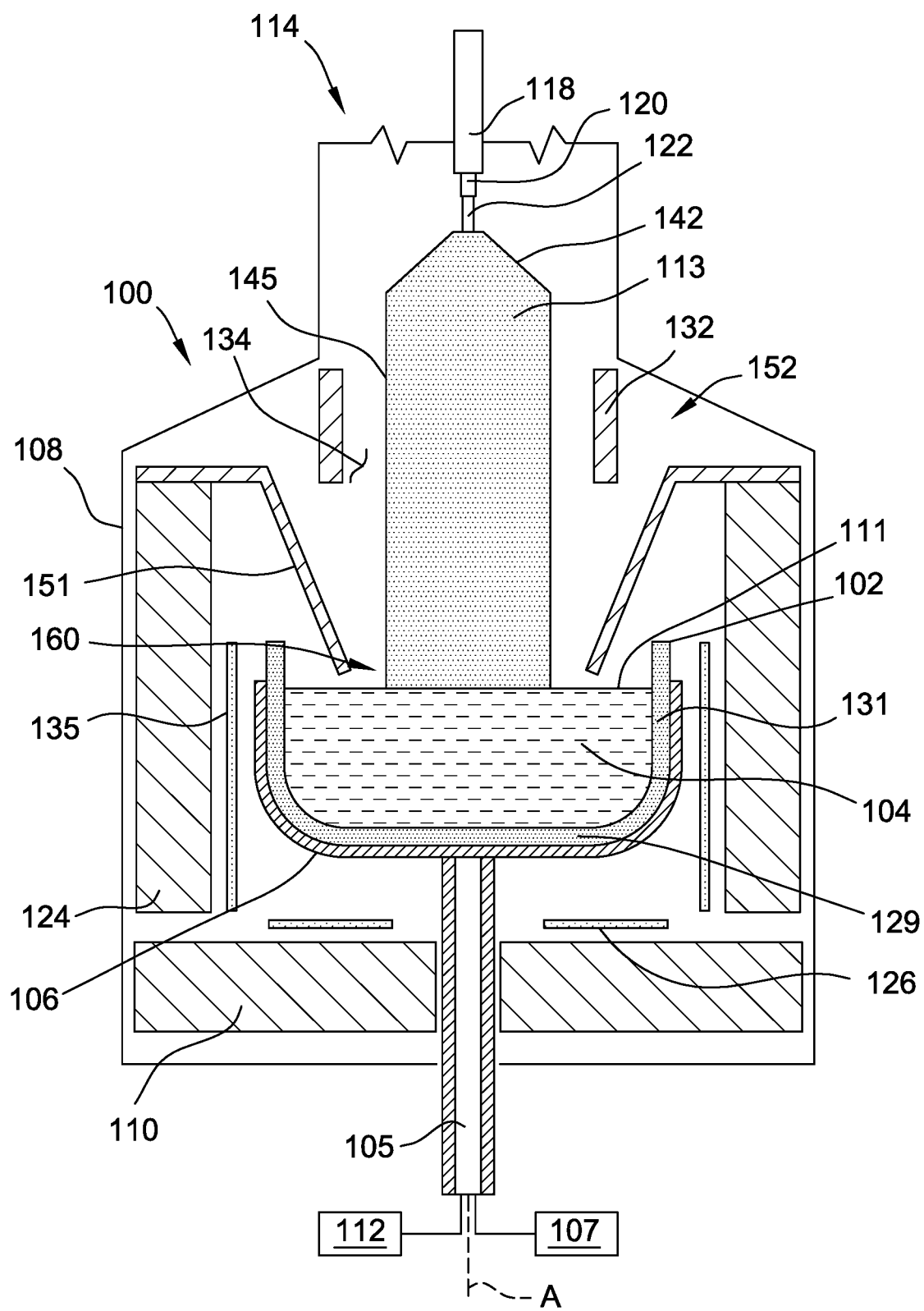
FIG. 1 is a cross-section view of an ingot puller apparatus.

An ingot puller apparatus (or more simply "ingot puller") for growing a monocrystalline silicon ingot is indicated generally at "100" in FIG. 1. The ingot puller apparatus 100 includes a crystal puller housing 108 that defines a growth chamber 152 for pulling a silicon ingot 113 from a melt 104 of silicon. The ingot puller apparatus 100 includes a crucible 102 disposed within the growth chamber 152 for holding the melt 104 of silicon. The crucible 102 is supported by a susceptor 106.

The crucible 102 includes a floor 129 and a sidewall 131 that extends upward from the floor 129. The sidewall 131 is generally vertical. The floor 129 includes the curved portion of the crucible 102 that extends below the sidewall 131. Within the crucible 102 is a silicon melt 104 having a melt surface 111 (i.e., melt-ingot interface). The susceptor 106 is supported by a shaft 105. The susceptor 106, crucible 102, shaft 105 and ingot 113 have a common longitudinal axis A or "pull axis" A.

A pulling mechanism 114 is provided within the ingot puller apparatus 100 for growing and pulling an ingot 113 from the melt 104. Pulling mechanism 114 includes a pulling cable 118, a seed holder or chuck 120 coupled to one end of the pulling cable 118, and a seed crystal 122 coupled to the seed holder or chuck 120 for initiating crystal growth. One end of the pulling cable 118 is connected to a pulley (not shown) or a drum (not shown or any other suitable type of lifting mechanism, tor example, a shaft, and the other end is connected to the chuck 120 that holds the seed crystal 122. In operation, the seed crystal 122 is lowered to contact the melt 104. The pulling mechanism 114 is operated to cause the seed crystal 122 to rise. This causes a single crystal ingot 113 to be pulled from the melt 104.

During heating and crystal pulling, a crucible drive unit 107 (e.g., a motor) rotates the crucible 102 and susceptor 106. A lift mechanism 112 raises and lowers the crucible 102 along the pull axis A during the growth process. As the ingot grows, the silicon melt 104 is consumed and the height of the melt in the crucible 102 decreases. The crucible 102 and susceptor 106 may be raised to maintain the melt surface 111 at or near the same position relative to the ingot puller apparatus 100.

A crystal drive unit (not shown) may also rotate the pulling cable 118 and ingot 113 in a direction opposite the direction in which the crucible drive unit 106 rotates the crucible 102 (e.g., counter-rotation). In embodiments using iso-rotation, the crystal drive unit may rotate the pulling cable 118 in the same direction in which the crucible drive unit 107 rotates the crucible 102. In addition, the crystal drive unit raises and lowers the ingot 113 relative to the melt surface 111 as desired during the growth process.

The ingot puller apparatus 100 may include an inert gas system to introduce and withdraw an inert gas such as argon from the growth chamber 152. The ingot puller apparatus 100 may also include a dopant feed system (not shown) for introducing dopant into the melt 104.

According to the Czochralski single crystal growth process, a quantity of polycrystalline silicon, or polysilicon, is charged to the crucible 102. The semiconductor or solar-grade material that is introduced into the crucible 102 is melted by heat provided from one or more heating elements. The ingot puller apparatus 100 includes bottom insulation 110 and side insulation 124 to retain heat in the puller apparatus 100. In the illustrated embodiment, the ingot puller apparatus 100 includes a bottom heater 126 disposed below the crucible floor 129. The crucible 102 may be moved to be in relatively close proximity to the bottom heater 126 to melt the polycrystalline charged to the crucible 102.

To form the ingot, the seed crystal 122 is contacted with the surface 111 of the melt 104. The pulling mechanism 114 is operated to pull the seed crystal 122 from the melt 104. The ingot 113 includes a crown portion 142 in which the ingot transitions and tapers outward from the seed crystal 122 to reach a target diameter. The ingot 113 includes a constant diameter portion 145 or cylindrical "main body" of the crystal which is grown by increasing the pull rate. The main body 145 of the ingot 113 has a relatively constant diameter. The ingot 113 includes a tail or end-cone (not shown) in which the ingot tapers in diameter after the main body 145. When the diameter becomes small enough, the ingot 113 is then separated from the melt 104. The ingot 113 has a central longitudinal axis A that extends through the crown portion 142 and a terminal end of the ingot 113.

The ingot puller apparatus 100 includes a side heater 135 and a susceptor 106 that encircles the crucible 102 to maintain the temperature of the melt 104 during crystal growth. The side heater 135 is disposed radially outward to the crucible sidewall 131 as the crucible 102 travels up and down the pull axis A. The side heater 135 and bottom heater 126 may be any type of heater that allows the side heater 135 and bottom heater 126 to operate as described herein. In some embodiments, the heaters 135, 126 are resistance heaters. The side heater 135 and bottom heater 126 may be controlled by a control system (not shown) so that the temperature of the melt 104 is controlled throughout the pulling process.

In accordance with embodiments of the present disclosure, the ingot puller apparatus 100 also includes a heat shield 151 disposed within the growth chamber 152 and above the melt 104 which shrouds the ingot 113 during ingot growth. The heat shield 151 may be partially disposed within the crucible 102 during crystal growth. The heat shield 151 defines a central passage 160 for receiving the ingot 113 as the ingot is pulled by the pulling mechanism 114.

The heat shield 151 has a leg segment 164 (FIG. 2) that extends along the pull axis A (FIG. 1). The leg segment 164 has a void 166 formed within the leg segment 164 (i.e., an empty space which contains gas). The void 166 is at the distal end 168 of the leg segment 164 and extends upward relative to the pull axis A. The leg segment 164 includes a leg segment housing 170 that defines a leg chamber 172 within the housing 170. The leg segment 164 includes insulation 174 within the chamber 172. The insulation 174 is supported by a ledge 155 that extends from the housing 170. The void 166 is below the insulation 174 and is also radially inward to the insulation 174. The insulation 174 may be separated from the leg segment housing 174 by a gap 154 to reduce thermal conduction. The leg segment housing 174 may have openings that allow inert gas (e.g., argon gas) to enter the housing and fill the void 166.

The leg segment housing 170 may be made of graphite or a graphite shell having molybdenum sheets within the shell to block radiation. Alternatively, the leg segment housing may be made of graphite capped with silicon carbide. The insulation 174 may be made of carbon (e.g., carbon-based rigid insulation), felt or layered molybdenum.

Figure 2:
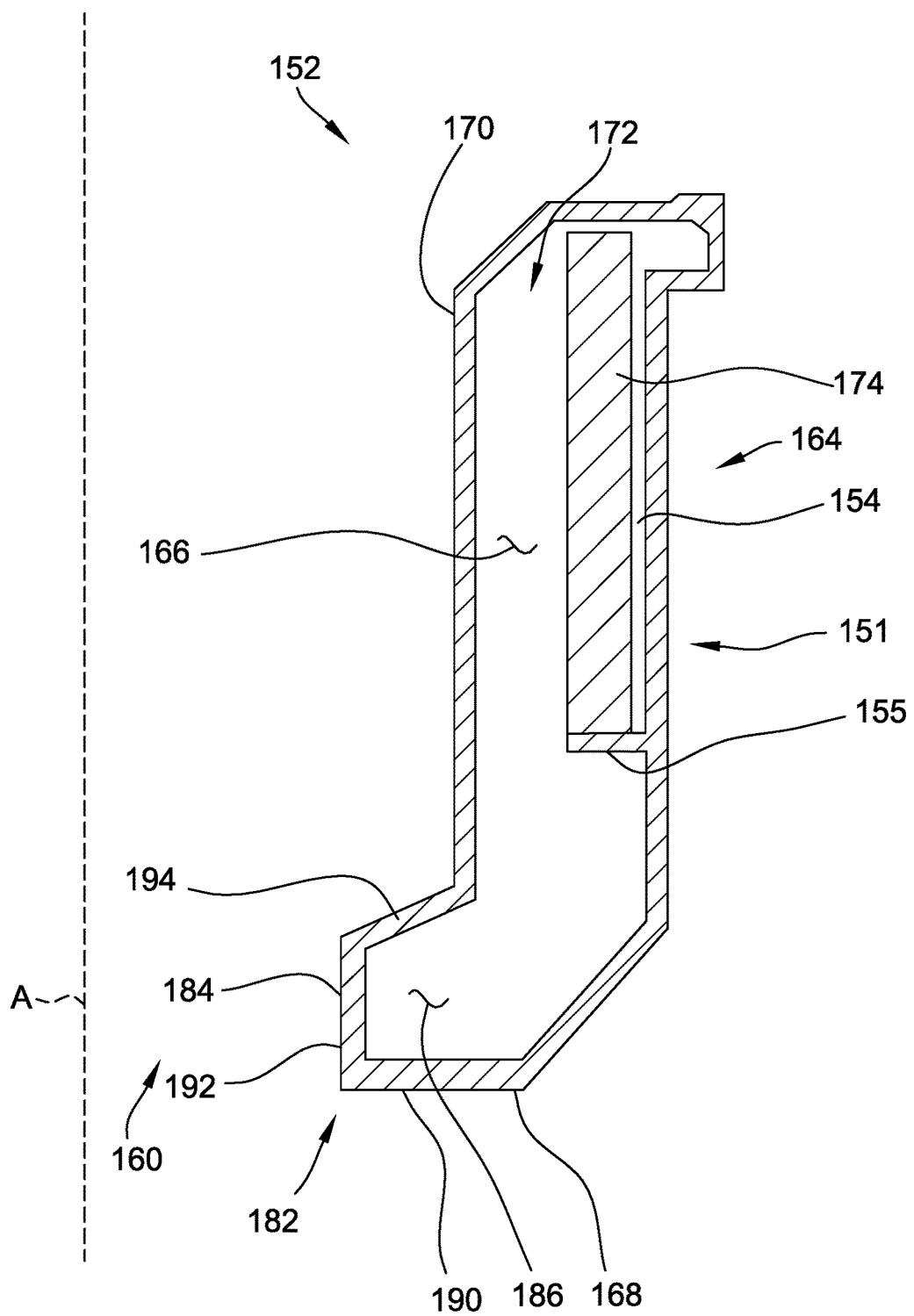
FIG. 2 is a cross-section view of a heat shield of the ingot puller apparatus.
Figure 7:
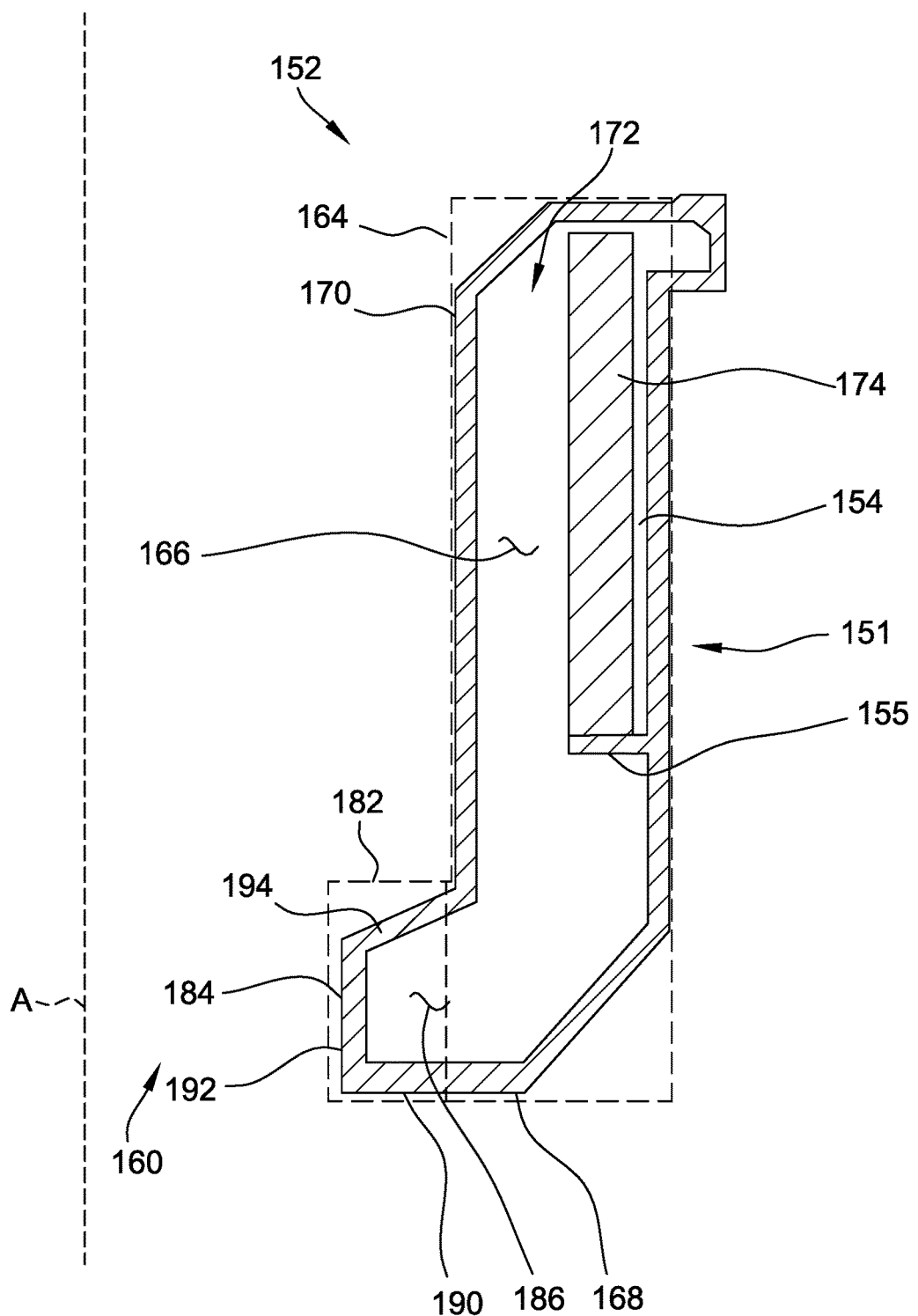
FIG. 7 is a cross-section view of the heat shield of FIG. 2 with the foot and leg segment shown in dashed boxes.

As shown in FIG. 2 and FIG. 7, the heat shield comprises a foot 182 that extends radially inward from the leg segment 164 toward the distal end 168 of the leg segment 164. The void 166 extends at least partially into the foot 182 (and extends through the entire foot in the embodiment of FIG. 2). The foot 182 comprises a foot housing 184 that defines a foot chamber 186. The foot housing 184 includes a floor 190, radially inward sidewall 192 and sloped top 194. The radially inward sidewall 192 is substantially parallel to the pull axis A (FIG. 1). In the embodiment shown in FIG. 2, there is no insulation disposed within the foot chamber 186.

In other embodiments, the foot chamber 186 includes an amount of insulation or other material (e.g., graphite) therein.

Figure 3:
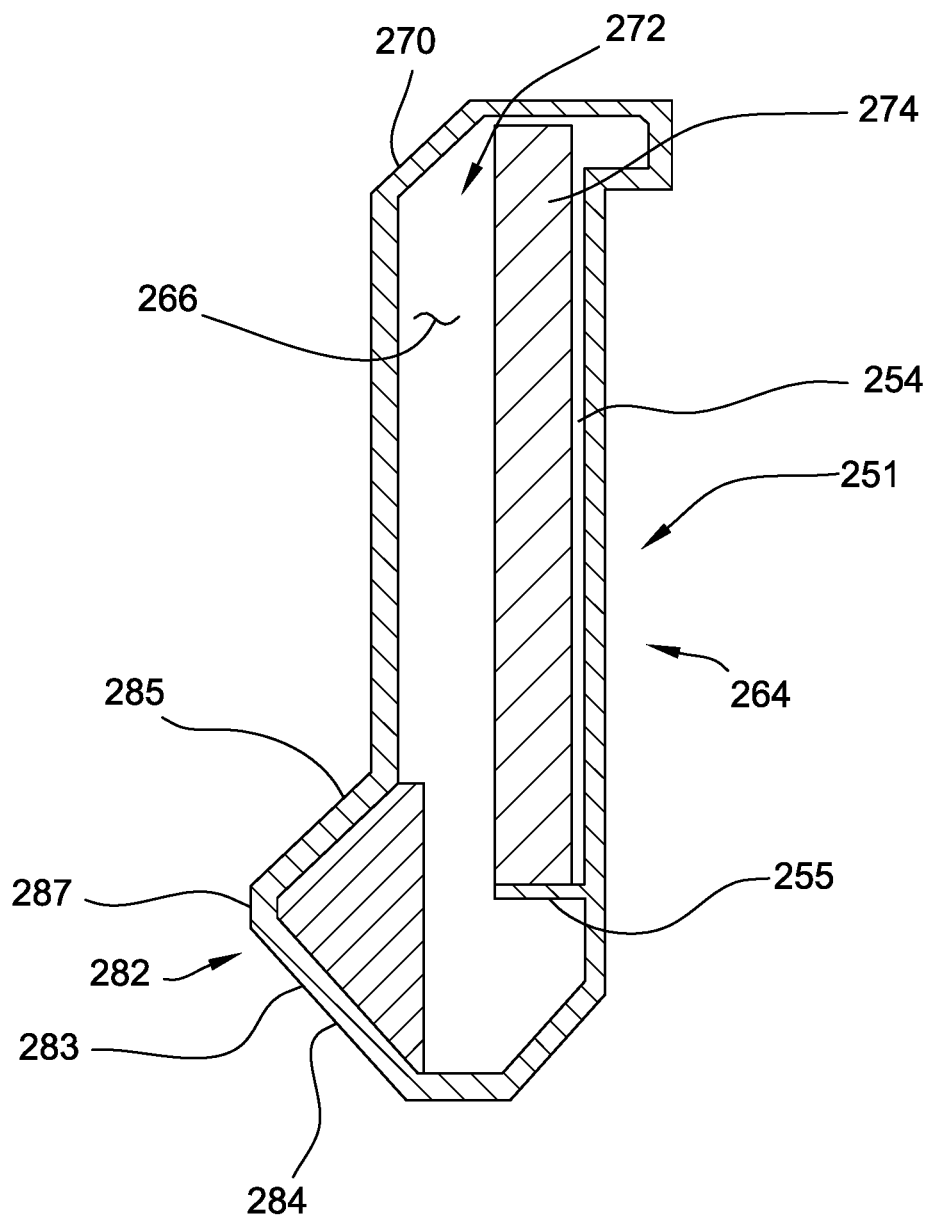
FIG. 3 is a cross-section view of another embodiment of a heat shield.
Figure 8:
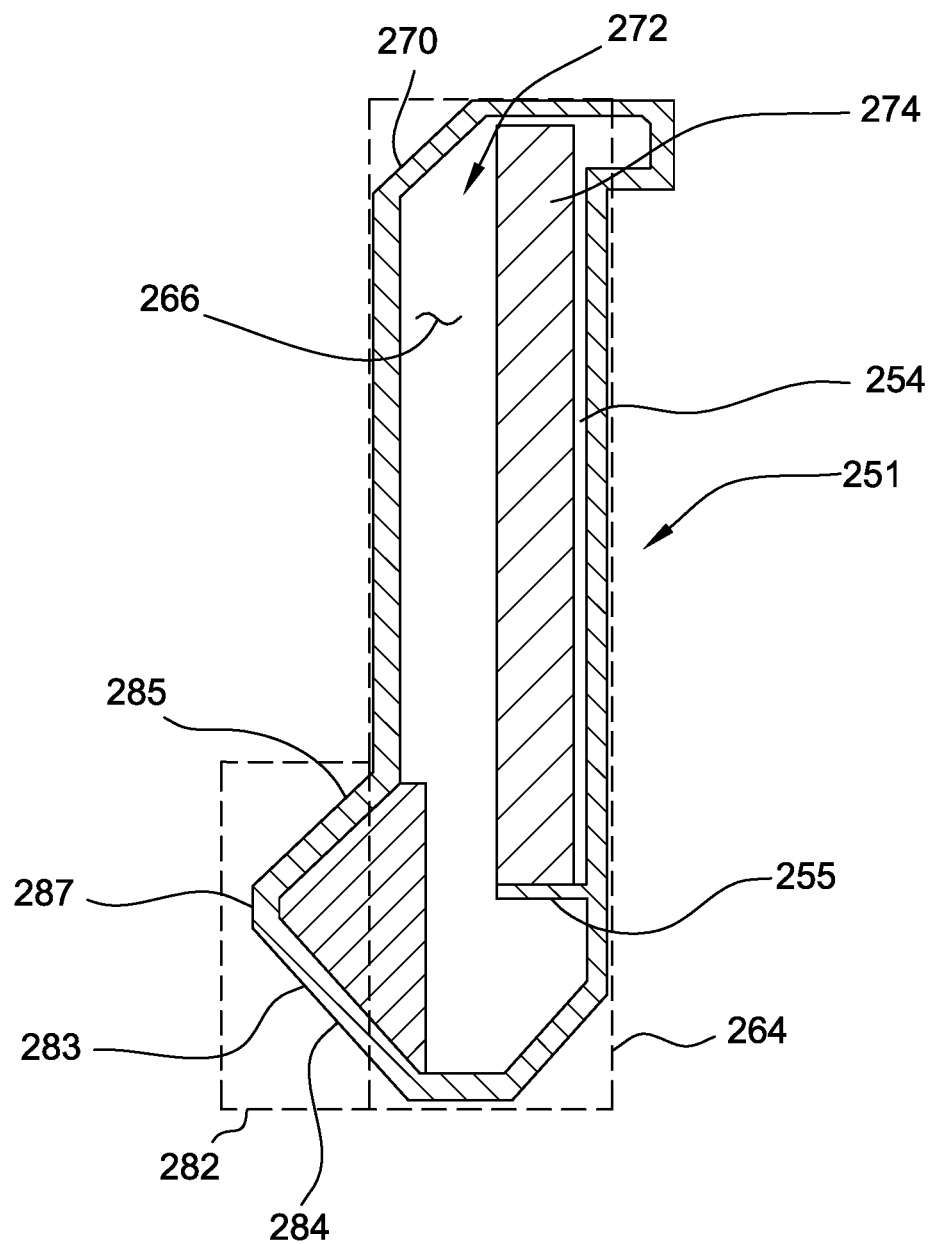
FIG. 8 is a cross-section view of the heat shield of FIG. 3 with the foot and leg segment shown in dashed boxes.

Another embodiment of the heat shield is shown in FIG. 3 and FIG. 8. The components shown in FIG. 3 that are analogous to those of FIG. 2 are designated by the corresponding reference number of FIG. 2 plus "100" (e.g., part 182 becomes 282). The heat shield 251 includes a leg segment 264 and a foot 282 that extends from the leg segment 264. The heat shield 251 includes a void 266 formed within a leg segment housing 270. The heat shield 251 includes insulation 274 within a leg chamber 272 formed within the leg segment 264. The void 266 extends below the insulation 174 and is also radially inward to the insulation 174.

The foot 282 includes a radially inward lower sidewall 283 and a radially inward upper sidewall 285. The radially inward lower sidewall 283 and radially inward upper sidewall 285 angle toward each other and form an apex 287 which is the most radially inward portion of the heat shield 251. In the illustrated embodiment, the apex 287 is an inner wall that is substantially parallel to the pull axis A (FIG. 1).

As shown in FIG. 3, the foot 282 does not include a void formed therein. The foot 282 may be made of graphite.

Referring again to FIG. 1, the ingot puller apparatus 100 includes a cooling jacket 132. That cooling jacket 132 at least partially overlaps the heat shield 151 along the pull axis A (FIG. 1). The cooling jacket 132 is radially inward to the heat shield 151. The cooling jacket defines a central passage 134 for receiving the ingot as the ingot is pulled by the pulling mechanism 114.

Compared to conventional ingot puller apparatus, the apparatus of the present disclosure have several advantages. Heat shields having voids (FIGS. 2-3) improve defect performance in the resulting wafers which mitigates the edge band (e.g., without changing the cooling jacket dimensions of the ingot puller apparatus). The heat shields enhance heat extraction in the 1685-1533° K. temperature range along the crystal edge. The heat shields keep a relative uniform temperature gradient at the 1533-1285° K. temperature region of the crystal and enhance the cooling effects for the rest of the crystal. The heat shields result in the temperature of the outer upper reflector to be maintained relatively high which reduces particle contamination. The heat shields also minimize heat loss resulting from the design modification (e.g., a power bump by 15-40 kw).

EXAMPLES

The processes of the present disclosure are further illustrated by the following Examples. These Examples should not be viewed in a limiting sense.

Example 1: Ingot Axial Temperature Gradient

Figure 4:
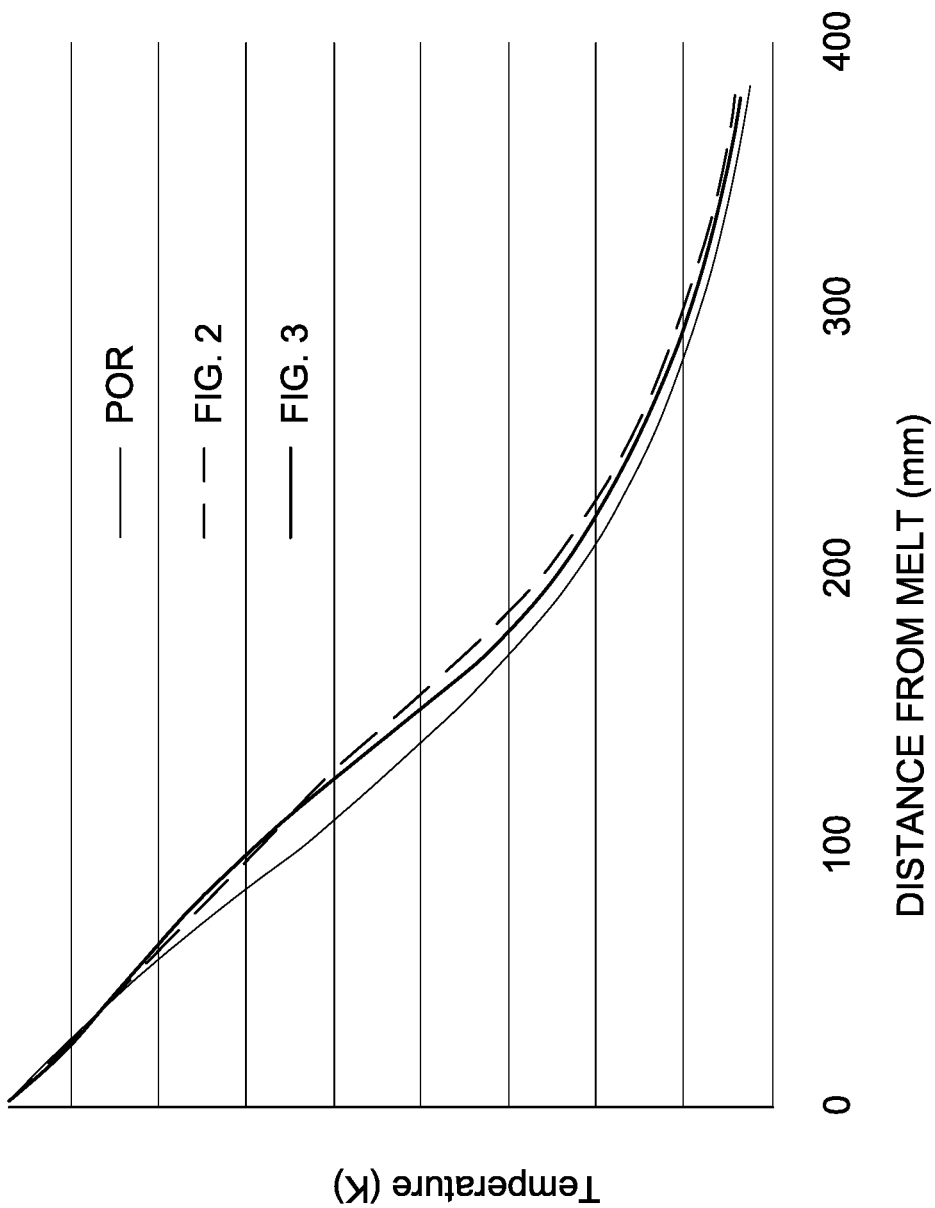
FIG. 4 is a graph of the axial ingot edge temperature measurement for an ingot grown by in a conventional ingot puller apparatus, an ingot grown in an ingot puller apparatus having the heat shield of FIG. 2, and an ingot grown in an ingot puller apparatus having the heat shield of FIG. 3.

FIG. 4 shows the axial ingot edge temperature measurement for an ingot grown in an ingot puller apparatus having a conventional heat shield ("POR") such as the heat shield 151 of FIG. 1 but with insulation throughout the heat shield. FIG. 4 also shows the axial ingot edge temperature measurement for an ingot puller apparatus that includes the heat shield of FIG. 2 with a void disposed in the heat shield ("FIG. 2") and for an ingot puller apparatus that includes the heat shield of FIG. 3 having a void disposed therein and having a foot having upper and lower sidewalls that angle toward each other ("FIG. 3"). As shown in FIG. 4, the heat shields of FIG. 2 and FIG. 3 reduce the incorporated vacancy concentration in the ingot, keep vacancies mobile for a longer time reducing the vacancy peak establish closer to the edge, and reduce growth of clusters.

By increasing cooling higher in the upper hotzone, the bottom of the heat shield is cooled relative to the conventional design.

Example 2: Defect Performance Between Heat Shield Designs

Figure 5:
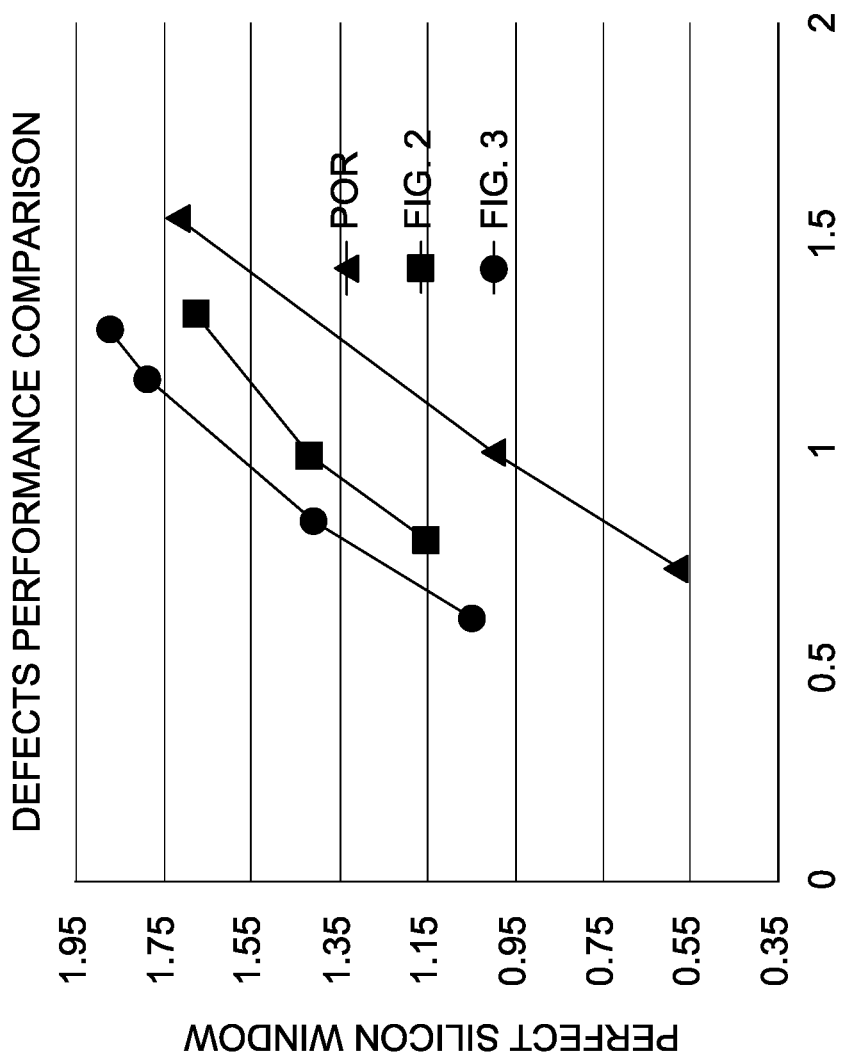
FIG. 5 is a graph of the defect performance and Perfect Silicon window for wafers sliced from an ingot grown by a conventional ingot puller apparatus, an ingot grown in an ingot puller apparatus having the heat shield of FIG. 2, and an ingot grown in an ingot puller apparatus having the heat shields of FIG. 3.
Figure 6:
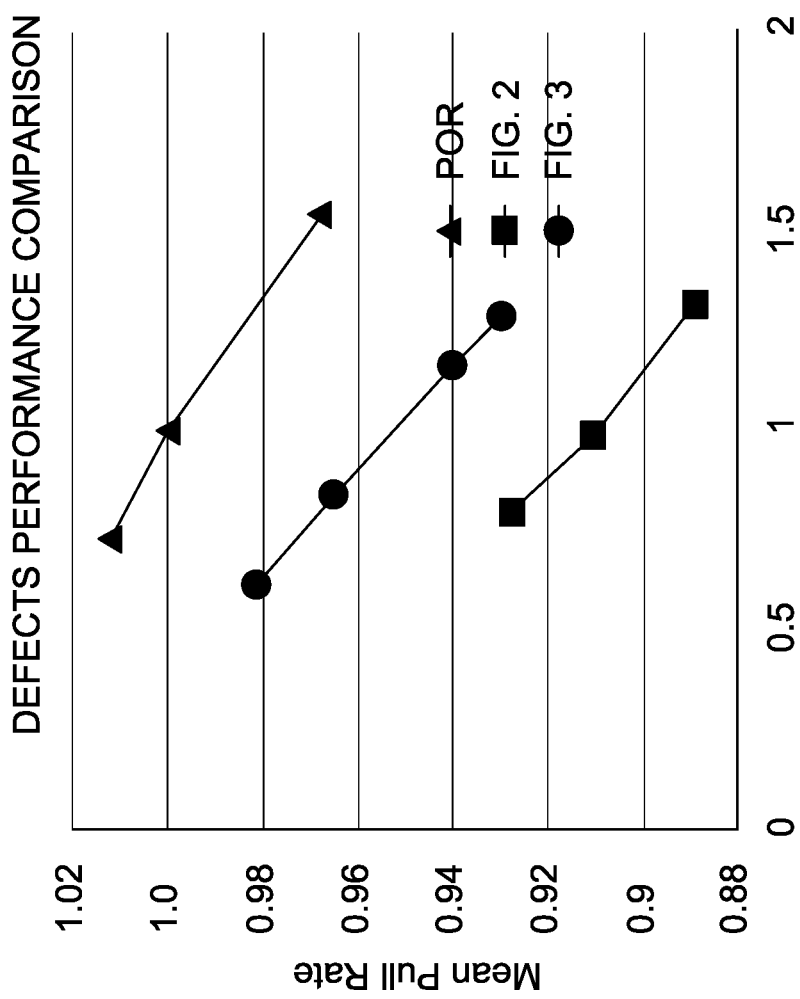
FIG. 6 is a graph of the defect performance and mean pull rate for wafers sliced from an ingot grown by a conventional ingot puller apparatus, an ingot grown in an ingot puller apparatus having the heat shield of FIG. 2, and an ingot grown in an ingot puller apparatus having the heat shields of FIG. 3.

FIGS. 5-6 show the defect performance for an ingot grown by a use of an ingot puller apparatus having a conventional heat shield ("POR") such as the heat shield 151 of FIG. 1 but with insulation throughout the heat shield. FIG. 4 also shows the axial ingot edge temperature measurement for an ingot grown in an ingot puller apparatus that includes a heat shield of FIG. 2 with a void in the heat shield ("FIG. 2") and an ingot grown in an ingot puller apparatus that includes the heat shield of FIG. 3 having a void therein and having a foot with upper and lower sidewalls that angle toward each other ("FIG. 3"). All parameters are scaled by POR performance for the purpose of better comparison. Both the design of FIG. 2 and the design of FIG. 3 have better defect performance than the conventional heat shield (POR). In both new designs, a 10%-35% improvement in the perfect silicon window (i.e., the range of pull rates at which perfect silicon is produced) can be achieved (FIG. 5) depending on specific process conditions with approximately a 10% lower pull rate (FIG. 6).

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing [s] shall be interpreted as illustrative and not in a limiting sense.

What is claimed is:

1. An ingot puller apparatus for growing a single crystal silicon ingot from a melt of silicon, the apparatus comprising:
    a puller housing defining a growth chamber;
    a crucible disposed within the growth chamber for containing the melt of silicon;
    a pulling mechanism for pulling the ingot from the melt along a pull axis; and
    a heat shield disposed within the growth chamber, the heat shield defining a central passage for receiving the ingot as the ingot is pulled by the pulling mechanism, the heat shield comprising:

a leg segment that extends downward relative to the pull axis, the leg segment comprising a leg segment housing that defines a leg chamber;
insulation disposed within the leg chamber;
a ledge disposed in the leg chamber, the insulation being supported by the ledge, the insulation being separated from the leg segment housing by a gap, the gap being disposed above the ledge; and
a foot that extends from the leg segment at a distal end of the leg segment, wherein a distance between at least a portion of the foot and the pull axis is less than a distance between the leg segment and the pull axis; and
wherein the leg segment has a void formed therein, at least a portion of the void being disposed below the ledge.

2. The ingot puller apparatus as set forth in claim 1 wherein the void extends into the foot.

3. The ingot puller apparatus as set forth in claim 1 wherein the void is radially aligned with the insulation.

4. The ingot puller apparatus as set forth in claim 1 wherein the insulation is made of carbon, felt, or layered molybdenum.

5. The ingot puller apparatus as set forth in claim 1 wherein the leg segment housing is made of graphite.

6. The ingot puller apparatus as set forth in claim 1 wherein the void is at least partially disposed within the foot.

7. The ingot puller apparatus as set forth in claim 6 wherein the foot comprises a foot housing that defines a foot chamber, there being no insulation disposed within the foot chamber.

8. The ingot puller apparatus as set forth in claim 6 wherein the foot comprises a foot housing, the foot housing having a sidewall that is parallel to the pull axis.

9. The ingot puller apparatus as set forth in claim 6 wherein the foot comprises a lower sidewall and an upper sidewall, the lower sidewall and upper sidewall angling toward each other and forming an apex.

10. The ingot puller apparatus as set forth in claim 1 wherein the foot does not include a void formed therein.

11. The ingot puller apparatus as set forth in claim 1 comprising a cooling jacket that at least partially overlaps the heat shield along the pull axis, the cooling jacket being radially inward to the heat shield, the cooling jacket defining a central passage for receiving the ingot as the ingot is pulled by the pulling mechanism.

* * * * *